United States Patent [19]

Dieny et al.

[11] Patent Number: 5,206,590
[45] Date of Patent: Apr. 27, 1993

[54] MAGNETORESISTIVE SENSOR BASED ON THE SPIN VALVE EFFECT

[75] Inventors: Bernard Dieny, San Jose; Bruce A. Gurney, Santa Clara; Steven E. Lambert, San Jose; Daniele Mauri, San Jose; Stuart S. P. Parkin, San Jose; Virgil S. Speriosu, San Jose; Dennis R. Wilhoit, Morgan Hill, all of Calif.

[73] Assignee: International Business Machines Corporation, Armonk, N.Y.

[21] Appl. No.: 625,343

[22] Filed: Dec. 11, 1990

[51] Int. Cl.$^5$ ................ G01R 33/02; H01L 43/08; G11C 19/08; G11B 5/39
[52] U.S. Cl. .................... 324/252; 360/113; 338/32 R
[58] Field of Search ............ 324/252; 338/32 R; 360/113

[56] References Cited

U.S. PATENT DOCUMENTS

| | | | |
|---|---|---|---|
| 4,447,839 | 5/1984 | Desserre et al. | 360/113 |
| 4,686,472 | 8/1987 | Van Ooijen et al. | 324/252 |
| 4,949,039 | 8/1990 | Grünberg | 324/252 |

FOREIGN PATENT DOCUMENTS 3820475 12/1989 Fed. Rep. of Germany .

OTHER PUBLICATIONS

"Enhanced Magnetoresistance in Layered Magnetic Structures with Antiferromagnetic Interlayer Exchange", G. Binasch, et al., Phys. Rev. B. V39 p. 4828 (1989).

"Thin Film Magnetoresistors in Memory, Storage, and Related Applications", D. A. Thompson, et al., IEEE Trans. Mag., p. 1039, (1975).

Primary Examiner—Walter E. Snow
Attorney, Agent, or Firm—Otto Schmid, Jr.; Leslie G. Murray

[57] ABSTRACT

A magnetoresistive (MR) sensor comprising a first and a second thin film layer of a magnetic material separated by a thin film layer of a non-magnetic metallic material. The first ferromagnetic layer is magnetically soft. The magnetization direction of the first layer of magnetic material is set substantially perpendicular to the magnetization of the second layer of magnetic material at zero applied field, and the magnetization direction of the second layer of magnetic material is fixed. A current flow is produced through the MR sensor, and the variations in voltage across the MR sensor are sensed due to changes in resistance of the MR sensor produced by rotation of the magnetization in the first layer of magnetic material as a function of the magnetic field being sensed. The variation of the resistance with the angle between the magnetizations of the first and second layers of magnetic material has been defined as the spin valve (SV) effect. It is also shown that, by a suitable direction of the current with respect to the fixed magnetization, the (SV) magnetoresistance can be added constructively to the usual anisotropic magnetoresistance.

16 Claims, 11 Drawing Sheets

MAGNETORESISTIVE SENSOR BASED ON THE SPIN VALVE EFFECT

BACKGROUND OF THE INVENTION

1. Field of the Invention

This invention relates in general to magnetic transducers for reading information signals from a magnetic medium and, in particular, to an improved magnetoresistive read transducer.

2. Description of the Prior Art

The prior art discloses a magnetic transducer referred to as a magnetoresistive (MR) sensor or head which has been shown to be capable of reading data from a magnetic surface at great linear densities. An MR sensor detects magnetic field signals through the resistance changes of a read element made from a magnetic material as a function of the amount and direction of magnetic flux being sensed by the element. These prior art MR sensors operate on the basis of the anisotropic magnetoresistive (AMR) effect in which a component of the resistance varies as $\cos^2$ of the angle between the magnetization and the direction of current flow. A more detailed description of the AMR effect can be found in the publication, "Thin Film Magnetoresistors in Memory, Storage, and Related Applications", D. A. Thompson et al., IEEE Trans. Mag., MAG-11, p. 1039, (1975). These MR sensors have operated on the basis of the AMR effect even though this effect produces only a very small percentage change in the resistance.

More recently, reports have been published of techniques for obtaining enhanced MR effects. One of these publications, "Enhanced Magnetoresistance in Layered Magnetic Structures with Antiferromagnetic Interlayer Exchange", G. Binasch et al., Phys. Rev. B. V39, p. 4828 (1989) and German patent DE3820475 describe a layered magnetic structure which yields enhanced MR effects caused by antiparallel alignment of the magnetization. However the saturation fields required to obtain these changes in resistance were too high and the effect too nonlinear and therefore unsuitable for producing a practical MR sensor.

The prior art does not show an MR device which produces enhanced MR effects at sufficiently low fields and which has a sufficiently linear response so that it is useful as an MR sensor.

SUMMARY OF THE INVENTION

It is therefore the principal object of this invention to produce an MR sensor having MR effects enhanced over AMR which has a substantially linear response at small applied fields.

In accordance with the invention, an MR sensor comprises a first and a second thin film layer of ferromagnetic material separated by a thin film layer of non-magnetic metallic material. The magnetization direction of the first layer of ferromagnetic material is set substantially perpendicular to the magnetization direction of the second layer of ferromagnetic material at zero applied field, and the magnetization direction of the second layer of ferromagnetic material is fixed. A current flow is produced through the MR sensor, and the variations in resistivity of the MR sensor produced by rotation of the magnetization in the first layer of ferromagnetic material is sensed as a function of the magnetic field being sensed.

The foregoing and other objects, features and advantages of the invention will be apparent from the following more particular description of a preferred embodiment of the invention as illustrated in accompanying drawings.

BRIEF DESCRIPTION OF THE DRAWINGS

FIGS. 1A and 1B show two related graphs, of which

DESCRIPTION OF THE PREFERRED EMBODIMENT

Prior art magnetoresistance sensors have been based on the anisotropic magnetoresistance (AMR) in which a component of the resistance varies as $\cos^2$ of the angle between the magnetization and the direction of current flow.

Recently, another mechanism has been identified in which the resistance between two uncoupled ferromagnetic layers is observed to vary as the cosine of the angle between the magnetizations of the two layers and is independent of the direction of current flow. This mechanism produces a magnetoresistance that for selected combinations of materials, is greater in magnitude than the AMR, and we have termed this the "spin valve" (SV) magnetoresistance.

Figure 1A:
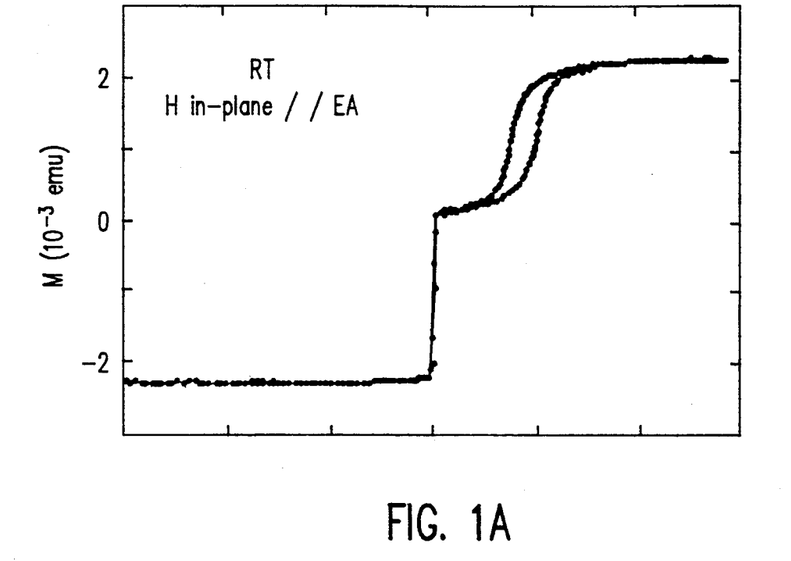
FIG. 1A is a graph of the room temperature hysteresis loop and FIG. 1B is a graph of the room temperature magnetoresistance of a specific embodiment of a proposed prior art layered magnetic structure.
Figure 1B:
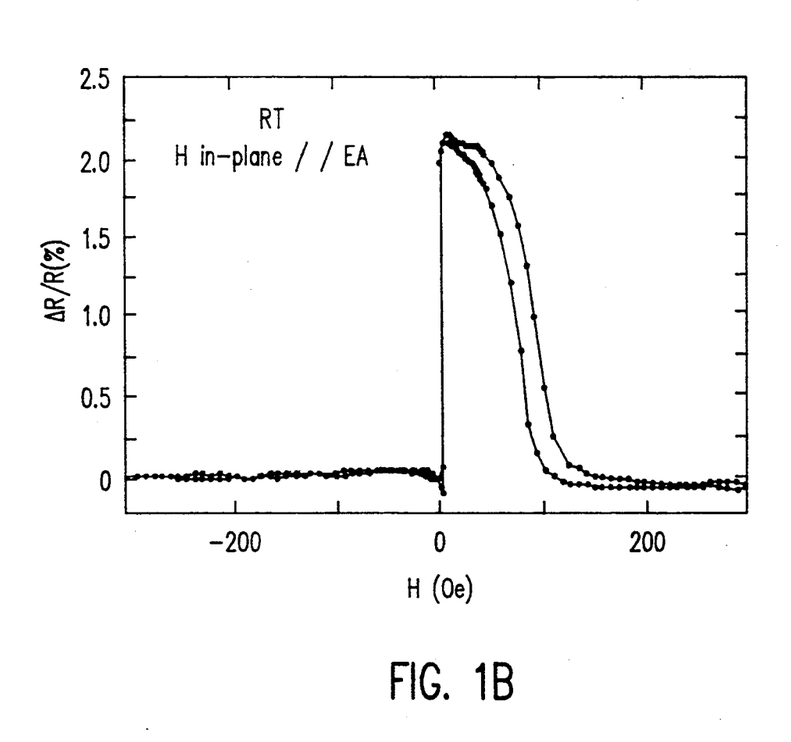

A specific embodiment of this SV structure was built on a silicon substrate comprising the following structure: Si/150Å NiFe/25Å Cu/150Å NiFe/100Å FeMn/20Å Ag. The hysteresis loop for this structure is shown in the graph of FIG. 1A, and this graph shows the two loops corresponding to the free and biased NiFe layers. The graph of FIG. 1B shows that the resistance increases by about 2% when the two ferromagnetic layers are antiparallel.

Figure 2:
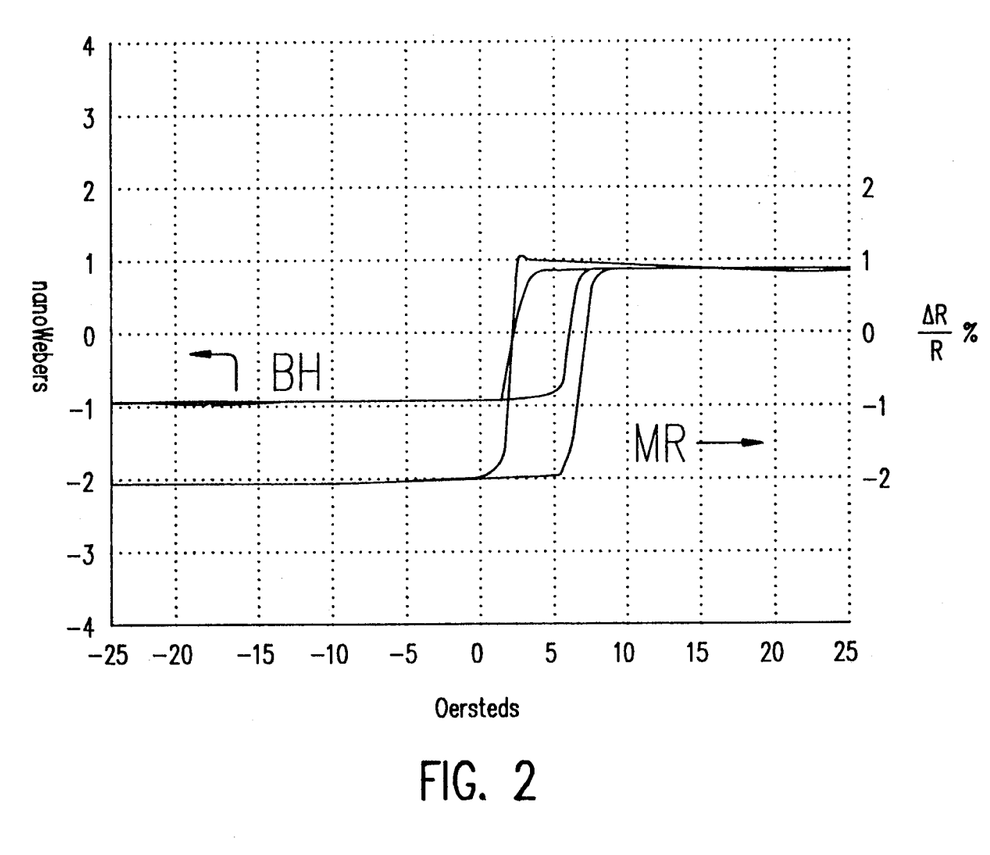
FIG. 2 is a graph which shows the B-H loop and the magnetoresistive response along the easy axis of a layered magnetic structure similar to that of FIGS. 1A and 1B, but on a greatly reduced x-axis scale.

FIG. 2 shows the BH loop and the MR response of a similar structure along the easy axis on a greatly expanded x-axis scale. This structure was built on a silicon substrate comprising the following structure: Si/60Å NiFe/25Å Cu/30Å NiFe/70Å FeMn/20Å Ag. The second NiFe layer is exchange biased to 170 Oe and does not switch in the range of field shown in the FIG. For fields applied along the hard axis (not shown), the spin valve response is considerably weaker, and thus less useful. Along the easy axis, the basic shape of the MR response suggests that it could be used as a magnetic field sensor. However, because of its coercivety, high squareness, and shift from the origin, the response of this structure is highly nonlinear. In addition, the changes in the first ferromagnetic layer are by domain wall motion, which are known to cause stability problems and which are known to be moving very slowly compared to domain rotation and therefore would severly limit the data rate. For these reasons the proposed prior art spin valve structures are unsuitable for use as a magnetic field sensor.

According to the present invention, we describe ways to linearize the response, decrease the coercivety, center the response, and have changes in response to an applied magnetic field be made by domain rotation so that a magnetic field sensor, based on spin valve structure, can be produced that exhibits a much greater change in magnetoresistance than the prior art MR sensors in response to a magnetic field no greater than that required for the prior art MR sensors.

Figure 3:
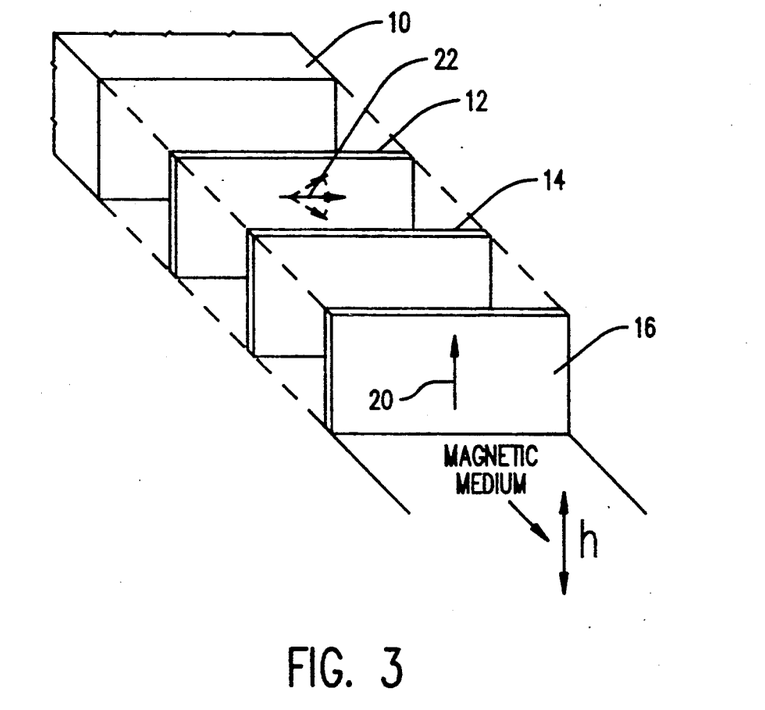
FIG. 3 is an exploded perspective schematic view of a specific embodiment of the magnetoresistive sensor according to the present invention.

This novel structure, according to the present invention, is shown in FIG. 3. The MR sensor comprises a suitable substrate 10 such as glass, ceramic or a semiconductor, for example, upon which is deposited a first thin film layer of soft ferromagnetic material 12, a thin film layer of a nonmagnetic metallic material 14, and a second thin film layer of ferromagnetic material 16. The two layers 12, 16 of ferromagnetic material are oriented with their magnetization at an angle of about 90 degrees in the absence of an applied magnetic field. In addition, the magnetization of the second layer of ferromagnetic material 16 is fixed in position as shown by the arrow 20. The magnetization in the first layer of ferromagnetic material 12, in the absence of an applied magnetic field, is shown by the arrow 22. Changes in magnetization in layer 12 are by rotation, in response to an applied magnetic field, (such as magnetic field h in FIG. 3) as shown dotted in FIG. 3.

In the embodiment of the invention shown in FIG. 3 the second layer of ferromagnetic material 16 is of a higher coercivety than that of the first layer of ferromagnetic layer 12 so that the magnetization of the layer 16 can be fixed in position. The specific embodiment shown in FIG. 4 provides two alternate ways to fix the magnetization of the second layer of ferromagnetic material 16 in position.

Figure 4:
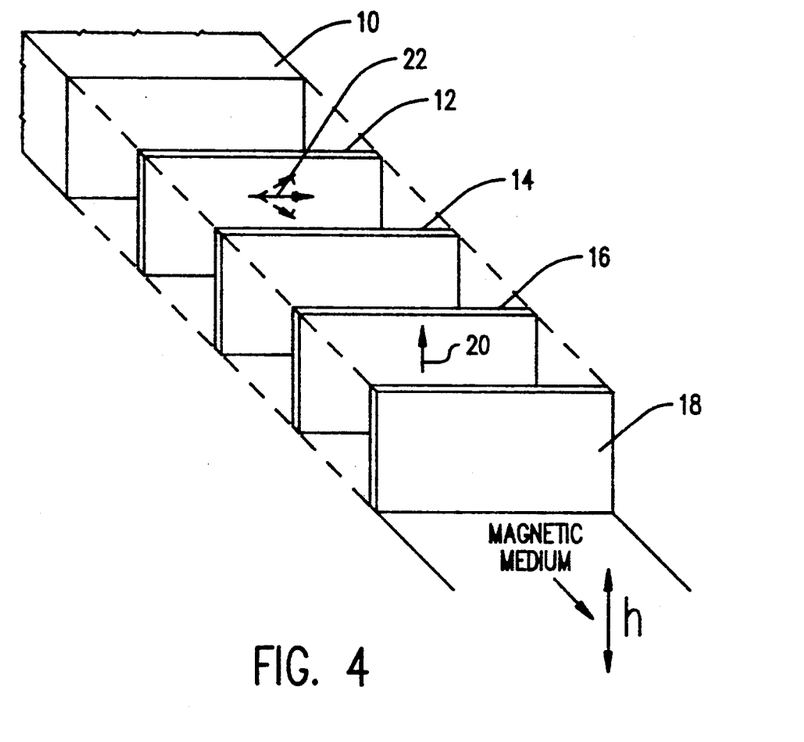
FIG. 4 is an exploded perspective schematic view of an alternate embodiment of the magnetoresistive sensor according to the present invention.

In the embodiment shown in FIG. 4, a thin film layer of an antiferromagnetic material 18 of high resistance is deposited in direct contact with the second thin film layer of ferromagnetic material 16 so that a biasing field can be produced by exchange coupling as is known in the art. Alternatively, layer 18 could be a ferromagnetic layer of sufficiently high squareness, high coercivety and high resistance. The structure of FIG. 4 may be inverted, so that layer 18 is deposited first, followed by layer 16, 14, and 12.

Figure 5:
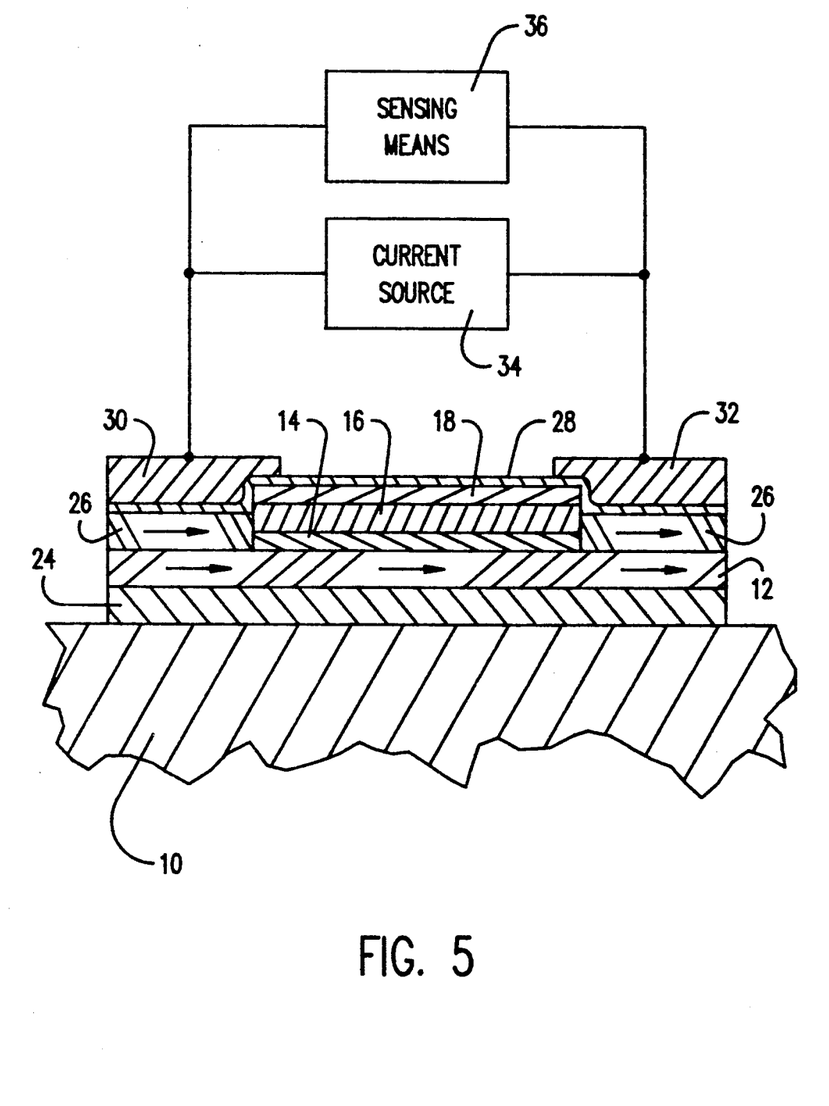
FIG. 5 is a section view of a further embodiment of the magnetoresistive sensor according to the present invention.

A further embodiment of a magnetoresistive sensor, according to the present invention, is shown in FIG. 5. In this embodiment of the invention, a suitable underlayer 24, such as Ta, Ru, or CrV, for example, is deposited on substrate 10 prior to the deposition of the first layer of ferromagnetic material 12. The purpose of underlayer 24 is to optimize the texture, grain size and morphology of the subsequent layers. The morphology is crucial in obtaining the large MR effects since it permits the use of a very thin spacer layer of a nonmagnetic metallic material 14. In addition, the underlayer must have a high resistivity to minimize shunting effects. The underlayer may also be used with the inverted structure described above. Should the substrate 10 have a sufficiently high resistivity, have a sufficiently planar surface, and have a suitable crystallographic structure, then underlayer 24 can be omitted.

Means for producing a longitudinal bias is provided to maintain layer 12 in a single domain state as indicated by the arrows in FIG. 5. In the specific embodiment shown, the means for producing a longitudinal bias comprises layers 26 of ferromagnetic material having high coercivety, high squareness, and high resistivity. Hard magnetic layers 26 are in contact with the end regions of ferromagnetic layer 12, and layers 26 are oriented with their magnetization in the direction shown by the arrows in FIG. 5.

Alternatively, antiferromagnetic layers can be deposited in contact with the end regions of layer 12 and oriented as shown by the arrows in FIG. 5 to produce the required longitudinal bias. These antiferromagnetic layers must have a sufficiently different blocking temperature than that of antiferromagnetic layer 18 which is used to fix the magnetization of the second ferromagnetic layer 16.

A capping layer 28 of a high resistivity material such as Ta, for example is then deposited over the MR sensor. Electrical leads 30 and 32 are provided to form a circuit path between the MR sensor structure, current source 34 and sensing means 36.

Figure 6:
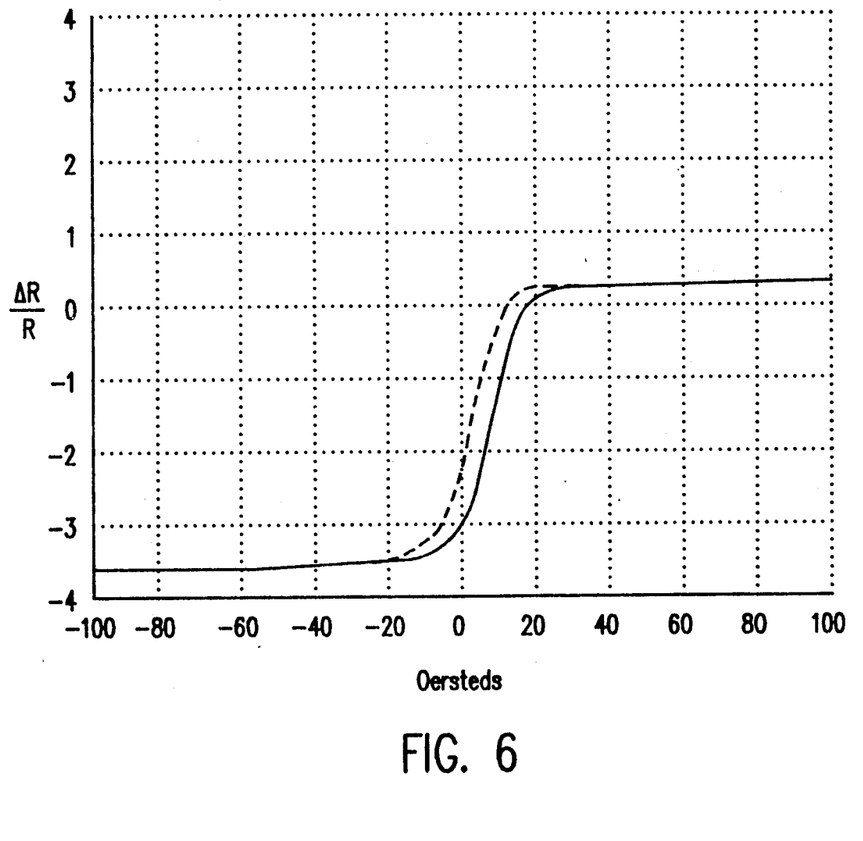
FIG. 6 is a graph showing the magnetoresistive response of the magnetoresistive sensor of the present invention.

FIG. 6 shows the magnetoresistive response of a specific embodiment of a magnetoresistive sensor according to the present invention. This structure comprises Si/Ta50Å/3x(NiFe 70Å/Cu 20Å/NiFe 50Å/FeMn 70Å/)Ta 50Å. Note that the magnetoresistive response is very linear over the range of about 0 to 15 Oe, has negligible coercivety, and the changes are by domain rotation. However, this response is not centered at zero field due to a slight ferromagnetic coupling of the two ferromagnetic layers 12, 16 through the layer 14 of nonmagnetic metallic material. Centering the response to zero field, as shown in the dashed line in FIG. 6, can be accomplished by several means. In an actual patterned structure, the magnetostatic interaction between the two ferromagnetic layers would tend to cancel the effect of coupling through the nonmagnetic metallic layer thereby centering the response. Another way of centering the response is by the appropriate choice of the magnitude and direction of the sense current. Another way of centering the response is by setting the easy axis of layer 12 at slightly more than 90 degrees with respect to the magnetization of layer 16. A further way of centering the response is by a small change in the angle between the magnetization in layers 12 and 16. Note that this response is very linear, is centered at zero field, and is sensitive to signals within the range encountered in magnetic recording applications. It can be seen that these characteristics make this an excellent magnetic field sensor for magnetic recording application.

The layered magnetic structure can be made by any suitable technique such as by sputtering, for example. The structure of FIG. 3 can be made by depositing the first thin film ferromagnetic layer 12 with a magnetic field oriented in the chosen direction to orient the easy axis of the film across the page as shown in FIG. 3.

Figure 7:
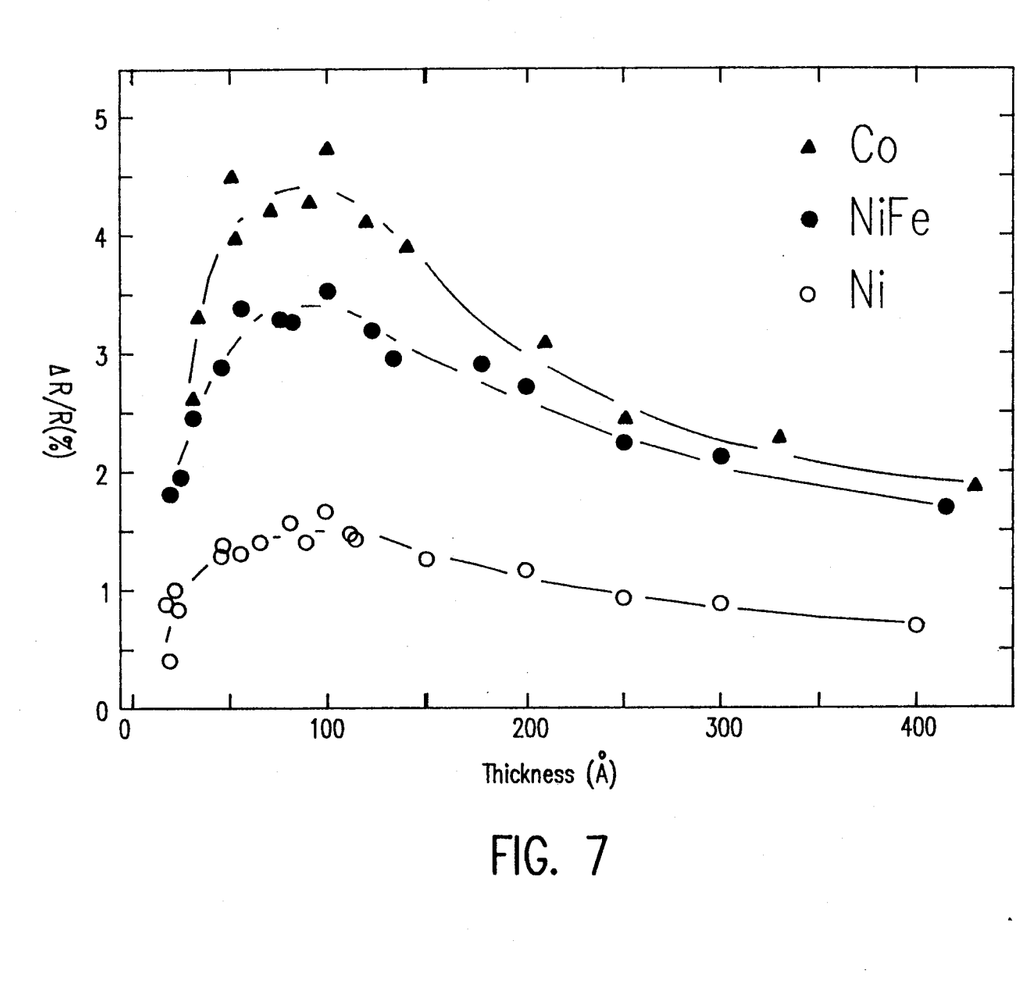
FIG. 7 is a graph of the amplitude of the magnetoresistance at room temperature versus the thickness of the free ferromagnetic layer for specific embodiments of the magnetoresistive sensor of the present invention.

The ferromagnetic layers 12, 16 can be made of any suitable magnetic materials such as Co, Fe, Ni and their alloys such as NiFe, NiCo, and FeCo, for example. The amplitude of the magnetoresistance varies with the thickness of the first thin film ferromagnetic layer 12 as shown in FIG. 7 for three selected magnetic materials Co, NiFe, and Ni. These three curves have very similar shapes characterized by a broad maximum between about 50Å and 150Å, so this is the preferred range for the thickness of the first ferromagnetic layer 12.

Figure 8:
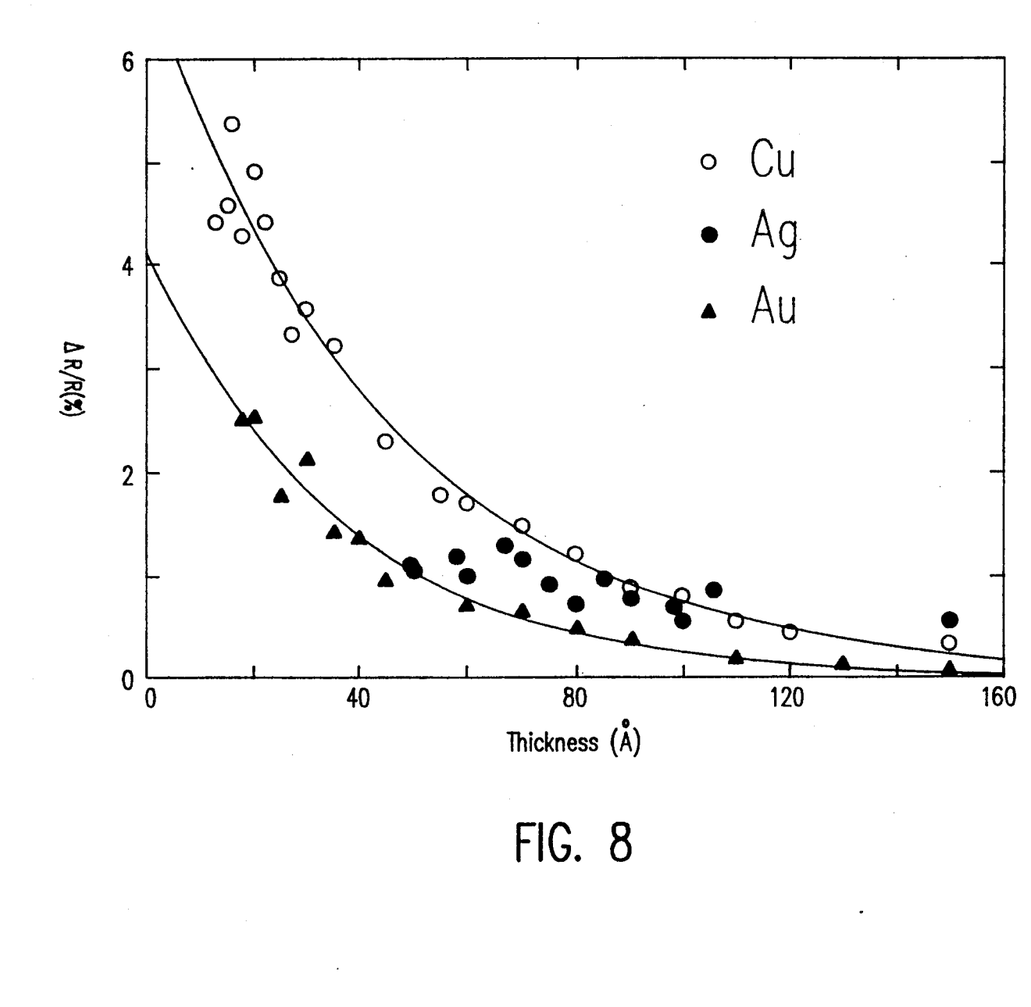
FIG. 8 is a graph of the amplitude of the magnetoresistance at room temperature versus the thickness of the spacer layer for a specific embodiment of the present invention.

The nonmagnetic spacer layer 14 is preferably metallic with high conductivity. Noble materials such as Au, Ag and Cu give large MR response, Pt and Pd give small MR response, while Cr and Ta exhibit very small MR response. The amplitude of the magnetoresistance also varies with the thickness of the nonmagnetic spacer layer 14 as shown in FIG. 8 for three selected materials Ag, Au and Cu. It can be seen that thinner layers produce a higher magnetoresistance; however, the operation of the sensor is based on having two essentially uncoupled ferromagnetic layers. Therefore, if the thickness of the spacer layer 14 is too small, it is not possible to switch one of the ferromagnetic layers 12, 16 without also switching the other layer. The minimum spacing for this purpose is about 16Å for films sputtered at or near room temperature. When the thickness of the spacer layer is within the range of about 80 to 100 angstroms, the resulting magnetoresistance is substantially the same as that produced by AMR. For these reasons, the thickness of the spacer layer 14 is preferably within the range of about 16Å to about 40Å.

To produce the sensor structure shown in FIG. 4, the layers are deposited as described above, and the antiferromagnetic layer 18 is then deposited. The thickness of the antiferromagnetic layer 18 must be chosen so that the blocking temperature is high enough with respect to the device working temperature (~50° C. typically). For Fe$_{50}$ Mn$_{50}$, thicknesses above 90Å are suitable. However, too great a thickness (above 150ÅA) would lead to a decrease of the MR response by a shunting of the current through this part of the structure. The proper direction of the exchange field created by this layer can be obtained by applying a magnetic field in the desired direction during deposition (a direction perpendicular to the easy axis of the first ferromagnetic layer 12) or after deposition by rapidly heating the structure above the blocking temperature and rapidly cooling to room temperature in a magnetic field applied perpendicular to the easy axis of the first ferromagnetic layer 12. In all cases the field to be detected by the sensor is along the hard axis of the first ferromagnetic layer 12. An inverted structure, where layer 18 is deposited first, followed by layers 16, 14 and 12 can be produced in a similar manner.

A sensor has been described which is linear, centered about zero field, has high sensitivity, and produces a magnetoresistance considerably greater than that produced by prior art sensors which used AMR principles. It is possible, by appropriate design choices, to produce a sensor which has a response equal to the sum of the SV magnetoresistance described above and the AMR response upon which prior art MR sensors were based.

Figure 9:
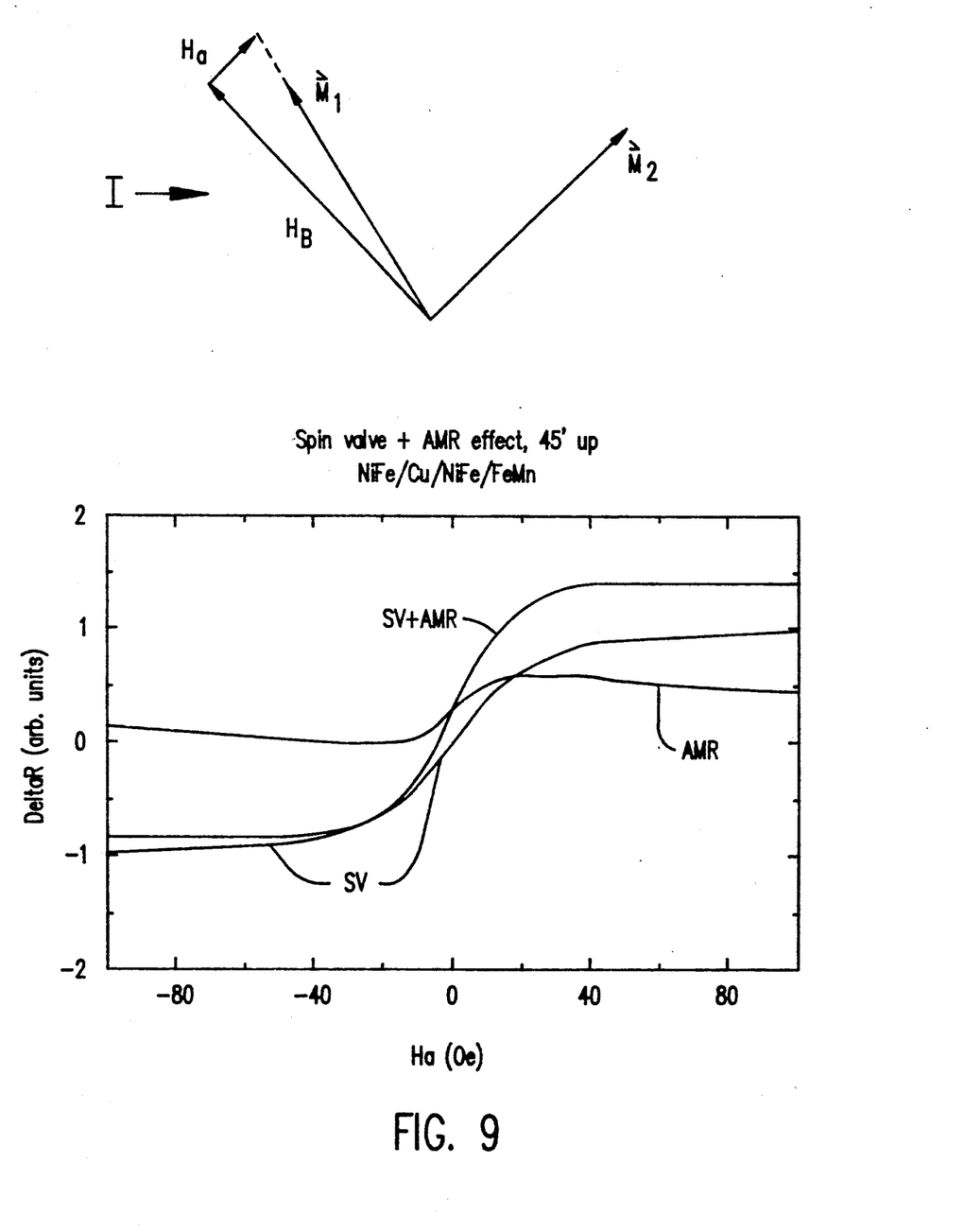
FIG. 9 is a graph showing one embodiment of the spin valve magnetoresistance, the anisotropic magnetoresistance, and their sum in which both total amplitude and rate of change near zero field are larger than either of the separate components.

FIG. 9 shows a plot of the SV magnetoresistance, which varies as the cosine of the angle between the magnetizations M1 and M2 due to the two ferromagnetic layers 12, 16, and this value is independent of the direction of current flow I. Also shown is a plot of AMR in which a component of resistance varies as cos$^2$ of the angle between the magnetization and the direction of current flow I. Magnetization M2 is fixed in position and magnetization M1 is oriented substantially perpendicular to M2 at zero applied field. The applied field has two orthogonal components H$_a$ and H$_b$. H$_a$ corresponds to the excitation field to be detected, and H$_b$ is a static bias field. The graph in FIG. 9 is based on a value of H$_b$ of 25 Oe and H$_a$ with the value indicated. The graph of AMR is based on the orientation of the two ferromagnetic layers with respect to the direction of current flow I shown in the diagram at the top of FIG. 9. The best effect for actual MR devices is to add the two effects, SV and AMR, by orientating the direction of current I substantially 90 degrees to the bisector of the angle between M$_1$ and M$_2$. The total response is larger than the SV value and the slope is higher.

Figure 10:
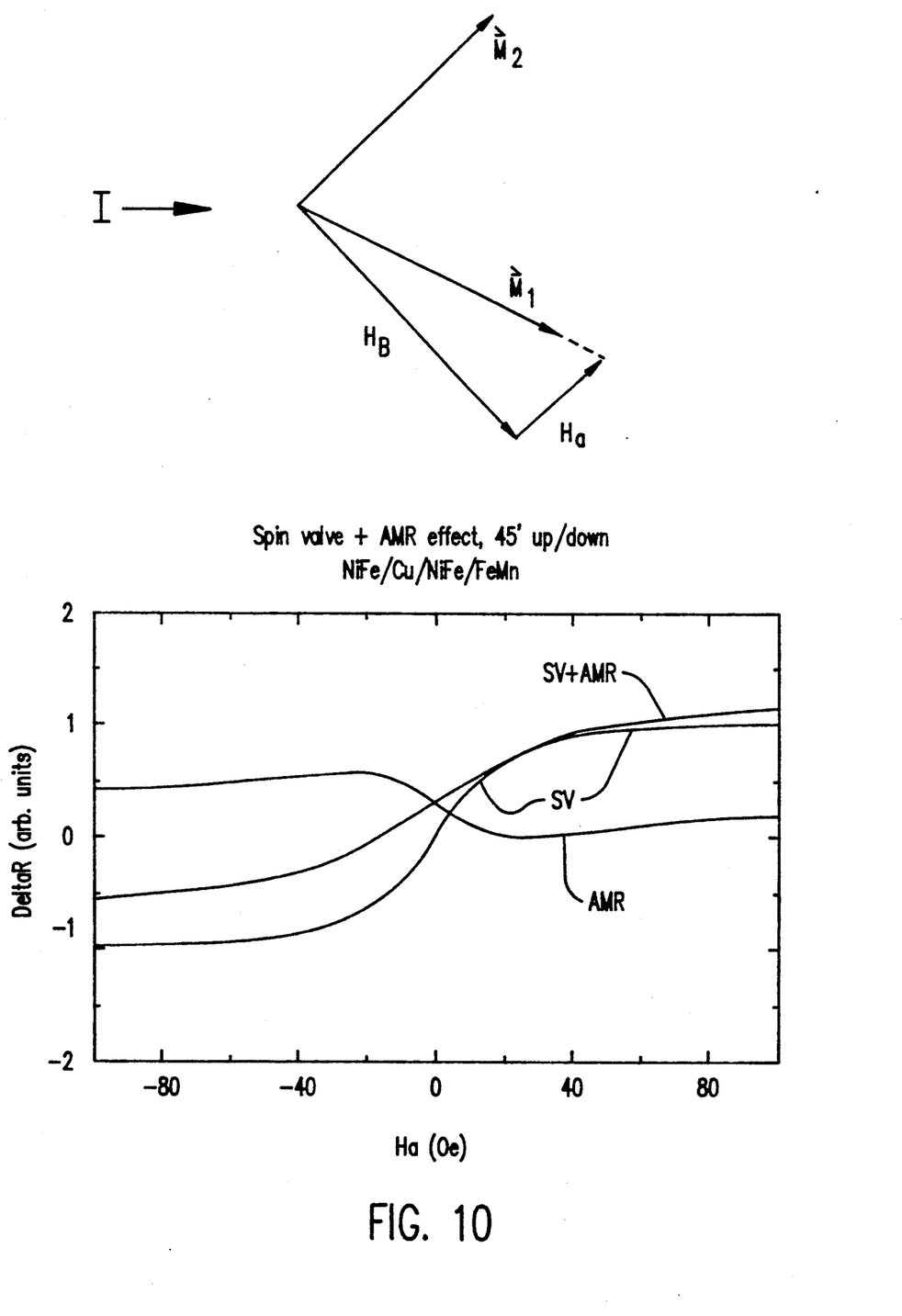
FIG. 10 is a graph showing another embodiment of the spin valve magnetoresistance, the anisotropic magnetoresistance, and their sum in which both total amplitude and rate of change near zero field are degraded with respect to that shown in FIG. 9.
Figure 11:
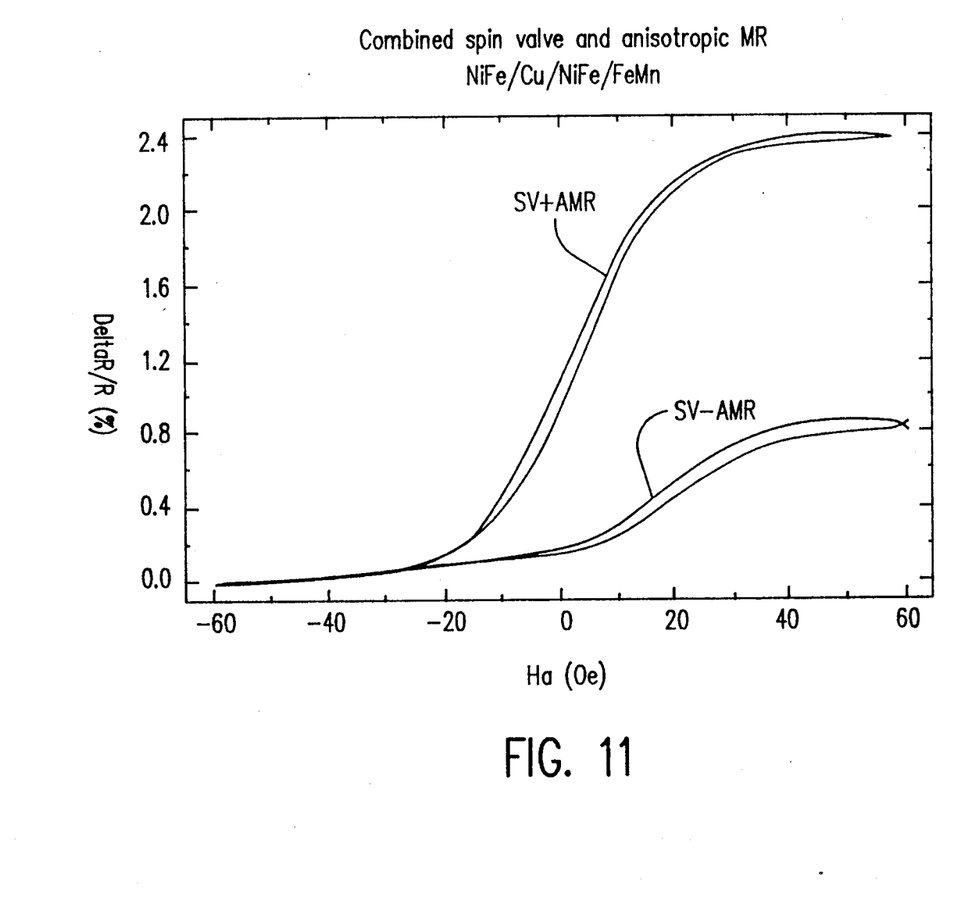
FIG. 11 is a graph showing experimental results of the magnetoresistance as a function of applied field for the arrangements in which anisotropic magnetoresistance either reinforces or degrades the spin valve magnetoresistance.

Care should be taken in choosing the direction of the sensing current with respect to the magnetization of the ferromagnetic layers. The graphs in FIG. 10 show that an inappropriate combination of the SV and AMR effects can also degrade the amplitude of the magnetoresistance. In this case the magnetization is oriented as shown in the diagram at the top of FIG. 10. In this case the combined response is less than the SV value and the slope is lower. FIG. 11 shows experimental data which demonstrate the SV and AMR effect combining in a particular fashion to obtain both the largest and smallest total MR response.

While the invention has been particularly shown and described with reference to a preferred embodiment thereof, it will be understood by those skilled in the art that various other changes in the form and details may be made therein without departing from the spirit and scope of the invention.

What is claimed is:

1. The magnetoresistive sensor comprising:
   a first and a second thin film layer of ferromagnetic material separated by a thin film layer of non-magnetic metallic material, the magnetization direction of said first layer of ferromagnetic material being substantially perpendicular to the magnetization direction of said second layer of ferromagnetic material at zero applied magnetic field;
   means for fixing the magnetization direction of said second layer of ferromagnetic material;
   means for producing a current flow through said magnetoresistive sensor; and
   means for sensing the variations in the resistivity of said magnetoresistive sensor due to rotation of the magnetization in said first layer of ferromagnetic material as a function of the magnetic field being sensed.

2. A magnetoresistive sensor comprising:
a first and a second layer of ferromagnetic material separated by a layer of non-magnetic metallic material, the magnetization direction of said first layer of ferromagnetic material being substantially perpendicular to the magnetization direction of said second layer of ferromagnetic material at zero applied magnetic field;
means for producing a longitudinal bias sufficient to maintain said first layer of ferromagnetic material in a single domain state;
means for producing a current flow through said magnetoresistive sensor; and
means for sensing the variations in the resistivity of said magnetoresistive sensor due to the difference in rotation of the magnetizations in said first and second layers of ferromagnetic materials as a function of the magnetic field being sensed.

3. The magnetoresistive sensor of claim 1 wherein said means for fixing the magnetization direction of said second layer of ferromagnetic material comprises providing said second layer of ferromagnetic material with a substantially higher coercivety than the coercivety of said first layer of ferromagnetic material.

4. The magnetoresistive sensor of claim 1 wherein said means for fixing the magnetization direction of said second layer of ferromagnetic material comprises a thin film layer of antiferromagnetic material in direct contact with said second layer of ferromagnetic material.

5. The magnetoresistive sensor of claim 1 wherein said means for fixing the magnetization direction of said second layer of ferromagnetic material comprises a thin film layer of a hard ferromagnetic material in direct contact with said second layer of ferromagnetic material.

6. The magnetoresistive sensor of claim 2 wherein said first layer of ferromagnetic material has a thickness within the range of about 50 to about 150 angstroms.

7. The magnetoresistive sensor of claim 1 wherein said first layer of ferromagnetic material has a thickness within the range of about 50 to about 150 angstroms.

8. The magnetoresistive sensor of claim 2 wherein said layer of non-magnetic material has a thickness within the range of about 16 to about 40 angstroms.

9. The magnetoresistive sensor of claim 1 wherein said layer of non-magnetic material has a thickness within the range of about 16 to about 40 angstroms.

10. The magnetoresistive sensor of claim 2 wherein said magnetization direction of said layers of ferromagnetic material is established relative to the direction of said current flow so that the anisotropic magnetoresistance is additive to said changes in resistance of said magnetoresistive sensor due to rotation of the magnetization in said layers of ferromagnetic material.

11. The magnetoresistive sensor of claim 1 wherein the magnetization direction of said layers of ferromagnetic material is established relative to the direction of said current flow so that the anisotropic magnetoresistance is additive to said changes in resistance of said magnetoresistive sensor due to rotation of the magnetization in said first layer of ferromagnetic material.

12. The magnetoresistive sensor of claim 2 wherein said means for producing a longitudinal bias comprises a layer of antiferromagnetic material in direct contact with the end regions only of said first layer of ferromagnetic material.

13. The magnetoresistive sensor of claim 2 wherein said means for producing a longitudinal bias comprises a layer of hard ferromagnetic material in direct contact with the end regions only of said first layer of ferromagnetic material.

14. The magnetoresistive sensor of claim 1 additionally comprising means for producing a longitudinal bias sufficient to maintain said first layer of ferromagnetic material in a single domain state.

15. The magnetoresistive sensor of claim 14 wherein said means for producing a longitudinal bias comprises a layer of antiferromagnetic material in direct contact with the end regions only of said first layer of ferromagnetic material.

16. The magnetoresistive sensor of claim 14 wherein said means for producing a longitudinal bias comprises a layer of hard ferromagnetic material in direct contact with the end regions only of said first layer of ferromagnetic material.

* * * * *